United States Patent [19]
Bruckert et al.

[11] Patent Number: 5,204,876
[45] Date of Patent: Apr. 20, 1993

[54] METHOD AND APPARATUS FOR PROVIDING HIGH DATA RATE TRAFFIC CHANNELS IN A SPREAD SPECTRUM COMMUNICATION SYSTEM

[75] Inventors: Eugene J. Bruckert, Arlington Heights, Ill.; Vedat Eyuboglu, Boston, Mass.; David D. Falconer, Nepean, Canada

[73] Assignee: Motorola, Inc., Schaumburg, Ill.

[21] Appl. No.: 669,127

[22] Filed: Mar. 13, 1991

[51] Int. Cl.$^5$ .............................. H04L 9/00
[52] U.S. Cl. .................................... 375/1
[58] Field of Search ............................. 375/1

[56] References Cited

U.S. PATENT DOCUMENTS

| | | | |
|---|---|---|---|
| 4,547,887 | 10/1985 | Mui | 375/1 |
| 4,724,435 | 2/1988 | Moses et al. | 375/1 |
| 4,901,307 | 2/1990 | Gilhousen et al. | |
| 5,016,255 | 5/1991 | Dixon et al. | 375/1 |

OTHER PUBLICATIONS

"On the System Design Aspects of Code Division Multiple Access (CDMA) Applied to Digital Cellular and Personal Communication Networks", Allen Salmasi and Klein S. Gilhousen at the *41rd IEEE Vehicular Technology Conference*, May 19-22, 1981 pp. 57-62.

"On the Capacity of a Cullular CDMA System", Klien Gilhousen, Irwin M. Jacobs, Roberto Padovani, Andrew Biterbi, Lindsay Weaver, Charles Wheately, *IEEE Transactions on Vehicular Technology*, vol. 40, No. 2 (May 1991), pp. 303-312.

*Primary Examiner*—Thomas H. Tarcza
*Assistant Examiner*—David Cain

[57] ABSTRACT

A method and apparatus is provided for transmitting spread spectrum signals. The transmitter receives data bits at a particular rate. Subsequently, the transmitter encodes the received data bits at a predetermined encoding rate into data symbols. Subsequently, the transmitter derives predetermined length orthogonal codes from the data symbols. The transmitter accommodates variable received data bit rates by setting the predetermined encoding rate and the predetermined orthogonal code length in response to the received data bit rate. Subsequently, the transmitter spreads the derived orthogonal codes with a user PN spreading code.

An alternative method and apparatus is provided for transmitting spread spectrum signals. The transmitter receives data bits at a particular rate. Subsequently, the transmitter encodes the received data bits at a predetermined encoding rate into data symbols. Subsequently, the transmitter determines a particular channel to transmit the data symbols by spreading the data symbols with a predetermined length orthogonal code. The transmitter accommodates variable received data bit rates by setting the predetermined encoding rate and the predetermined orthogonal code length in response to the received data bit rate.

28 Claims, 2 Drawing Sheets

METHOD AND APPARATUS FOR PROVIDING HIGH DATA RATE TRAFFIC CHANNELS IN A SPREAD SPECTRUM COMMUNICATION SYSTEM

FIELD OF THE INVENTION

The present invention relates to communication systems which employ spread-spectrum signals and, more particularly, to a method and apparatus for providing high data rate traffic channels in a spread spectrum communication system.

BACKGROUND OF THE INVENTION

Communication systems take many forms. In general, the purpose of a communication system is to transmit information-bearing signals from a source, located at one point, to a user destination, located at another point some distance away. A communication system generally consists of three basic components: transmitter, channel, and receiver. The transmitter has the function of processing the message signal into a form suitable for transmission over the channel. This processing of the message signal is referred to as modulation. The function of the channel is to provide a physical connection between the transmitter output and the receiver input. The function of the receiver is to process the received signal so as to produce an estimate of the original message signal. This processing of the received signal is referred to as demodulation.

Two types of two-way communication channels exist, namely, point-to-point channels and point-to-multipoint channels. Examples of point-to-point channels include wirelines (e.g., local telephone transmission), microwave links, and optical fibers. In contrast, point-to-multipoint channels provide a capability where many receiving stations may be reached simultaneously from a single transmitter (e.g. cellular radio telephone communication systems). These point-to-multipoint systems are also termed Multiple Access Systems (MAS).

Analog and digital transmission methods are used to transmit a message signal over a communication channel. The use of digital methods offers several operational advantages over analog methods, including but not limited to: increased immunity to channel noise and interference, flexible operation of the system, common format for the transmission of different kinds of message signals, improved security of communication through the use of encryption, and increased capacity.

These advantages are attained at the cost of increased system complexity. However, through the use of very large-scale integration (VLSI) technology a cost-effective way of building the hardware has been developed.

To transmit a message signal (either analog or digital) over a bandpass communication channel, the message signal must be manipulated into a form suitable for efficient transmission over the channel. Modification of the message signal is achieved by means of a process termed modulation. This process involves varying some parameter of a carrier wave in accordance with the message signal in such a way that the spectrum of the modulated wave matches the assigned channel bandwidth. Correspondingly, the receiver is required to recreate the original message signal from a degraded version of the transmitted signal after propagation through the channel. The re-creation is accomplished by using a process known as demodulation, which is the inverse of the modulation process used in the transmitter.

In addition to providing efficient transmission, there are other reasons for performing modulation. In particular, the use of modulation permits multiplexing, that is, the simultaneous transmission of signals from several message sources over a common channel. Also, modulation may be used to convert the message signal into a form less susceptible to noise and interference.

For multiplexed communication systems, the system typically consists of many remote units (i.e. subscriber units) which require active service over a communication channel for a short or discrete intervals of time rather than continuous service on a communication channel at all times. Therefore, communication systems have been designed to incorporate the characteristic of communicating with many remote units for brief intervals of time on the same communication channel. These systems are termed multiple access communication systems.

One type of multiple access communication system is a spread spectrum system. In a spread spectrum system, a modulation technique is utilized in which a transmitted signal is spread over a wide frequency band within the communication channel. The frequency band is much wider than the minimum bandwidth required to transmit the information being sent. A voice signal, for example, can be sent with amplitude modulation (AM) in a bandwidth only twice that of the information itself. Other forms of modulation, such as low deviation frequency modulation (FM) or single sideband AM, also permit information to be transmitted in a bandwidth comparable to the bandwidth of the information itself. However, in a spread spectrum system, the modulation of a signal to be transmitted often includes taking a baseband signal (e.g., a voice channel) with a bandwidth of only a few kilohertz, and distributing the signal to be transmitted over a frequency band that may be many megahertz wide. This is accomplished by modulating the signal to be transmitted with the information to be sent and with a wideband encoding signal.

Three general types of spread spectrum communication techniques exist, including:

The modulation of a carrier by a digital code sequence whose bit rate is higher than the information signal bandwidth. Such systems are referred to as "direct sequence" modulated systems.

Carrier frequency shifting in discrete increments in a pattern dictated by a code sequence. These systems are called "frequency hoppers." The transmitter jumps from frequency to frequency within some predetermined set; the order of frequency usage is determined by a code sequence. Similarly "time hopping " and "time-frequency hopping" have times of transmission which are regulated by a code sequence.

Pulse-FM or "chirp" modulation in which a carrier is swept over a wide band during a given pulse interval.

Information (i.e. the message signal) can be embedded in the spectrum signal by several methods. One method is to add the information to the spreading code before it is used for spreading modulation. This technique can be used in direct sequence and frequency hopping systems. It will be noted that the information being sent must be in a digital form prior to adding it to the spreading code because the combination of the spreading code typically a binary code involves modulo-2 addition. Alternatively, the information or message signal may be used to modulate a carrier before spreading it.

Thus, a spread spectrum system must have two properties: (1) the transmitted bandwidth should be much greater than the bandwidth or rate of the information being sent and (2) some function other than the information being sent is employed to determine the resulting modulated channel bandwidth.

The essence of the spread spectrum communication involves the art of expanding the bandwidth of a signal, transmitting the expanded signal and recovering the desired signal by remapping the received spread spectrum into the original information bandwidth. Furthermore, in the process of carrying out this series of bandwidth trades, the purpose of spread spectrum techniques is to allow the system to deliver error-free information in a noisy signal environment.

Spread spectrum communication systems can be multiple access communication systems. One type of multiple access spread spectrum system is a code division multiple access (CDMA) system. In a CDMA system, communication between two communication units is accomplished by spreading each transmitted signal over the frequency band of the communication channel with a unique user spreading code. As a result, transmitted signals are in the same frequency band of the communication channel and are separated only by unique user spreading codes. Particular transmitted signals are retrieved from the communication channel by despreading a signal representative of the sum of signals in the communication channel with a user spreading code related to the particular transmitted signal which is to be retrieved from the communication channel. A CDMA system may use direct sequence or frequency hopping spreading techniques.

Many digital cellular telecommunication systems have the ability to provide reduced data rate traffic channels. These systems have traffic channels designed to operate a particular data rate and also have reduced data rate traffic channels which provide more traffic data capacity than that at the designed data rate. This increased traffic data capacity is achieved at the cost of reduced quality and/or increased complexity speech coders and decoders. However, in spread spectrum communication systems there is also a need for systems which provide increased or high data rate traffic channels which allow the transmission of data at a rate higher than the designed data rate traffic channels.

SUMMARY OF THE INVENTION

A method and apparatus is provided for transmitting spread spectrum signals. The transmitter receives data bits at a particular rate. Subsequently, the transmitter encodes the received data bits at a predetermined encoding rate into data symbols. Subsequently, the transmitter derives predetermined length orthogonal codes from the data symbols. The transmitter accommodates variable received data bit rates by setting the predetermined encoding rate and the predetermined orthogonal code length in response to the received data bit rate. Subsequently, the transmitter spreads the derived orthogonal codes with a user PN spreading code.

An alternative method and apparatus is provided for transmitting spread spectrum signals. The transmitter receives data bits at a particular rate. Subsequently, the transmitter encodes the received data bits at a predetermined encoding rate into data symbols. Subsequently, the transmitter determines a particular channel to transmit the data symbols by spreading the data symbols with a predetermined length orthogonal code. The transmitter accommodates variable received data bit rates by setting the predetermined encoding rate and the predetermined orthogonal code length in response to the received data bit rate.

DETAILED DESCRIPTION

Figure 1:
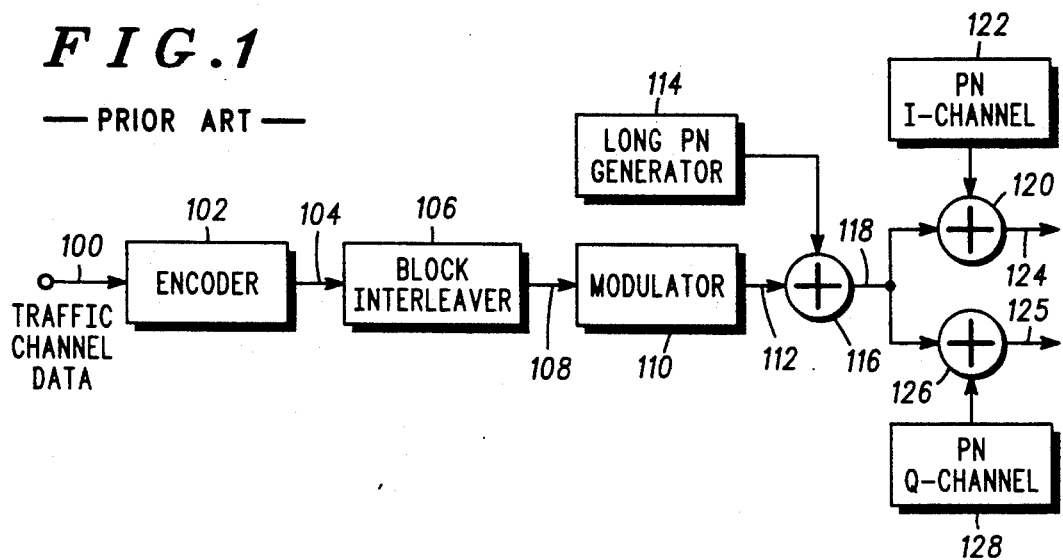
FIG. 1 is a diagram showing a prior art spread spectrum transmitter.

Referring now to FIG. 1, a prior art spread spectrum transmitter as substantially described in "On the System Design Aspects of Code Division Multiple Access (CDMA) Applied to Digital Cellular and Personal Communication Networks", Allen Salmasi and Klein S. Gilhousen, presented at the 41st IEEE Vehicular Technology Conference on May 19-22, 1991 in St. Louis, MO, pages 57-62, is shown. In the prior art spread spectrum transmitter, traffic channel data bits 100 are input to an encoder 102 at a particular bit rate (e.g., 9.6 kbit/s). The traffic channel data bits can include either voice converted to data by a vocoder, pure data, or a combination of the two types of data. Encoder 102 convolutionally encodes the input data bits 100 into data symbols at a fixed encoding rate. For example, encoder 102 encodes received data bits 100 at a fixed encoding rate of one data bit to three data symbols such that the encoder 102 outputs data symbols 104 at a 28.8 ksym/s rate. The encoder 102 accommodates the input of data bits 100 at variable rates by encoding repetition. That is when the data bit rate is slower than the particular bit rate at which the encoder 102 is designed to operate, then the encoder 102 repeats the input data bits 100 such that the input data bits 100 are provided to the encoding elements within the encoder 102 at the equivalent of the input data bit rate at which the encoding elements are designed to operate. Thus, the encoder 102 outputs data symbols 104 at the same fixed rate regardless of the rate at which data bits 100 are input to the encoder 102.

The data symbols 104 are then input into an interleaver 106. Interleaver 106 block interleaves the input data symbols 104. In the interleaver 106, the data symbols are input column by column into a matrix and output from the matrix row by row. The interleaved data symbols 108 are output by the interleaver 106 at the same data symbol rate that they were input (e.g., 28.8 ksym/s).

The interleaved data symbols 108 are then input to a modulator 110. The modulator 110 derives a sequence of fixed length Walsh codes 112 (e.g., 64-ary orthogonal codes) from the interleaved data symbols 108. In 64-ary orthogonal code signalling, the interleaved data symbols 108 are grouped into sets of six to select one out of the 64 orthogonal codes to represent the set of six data symbols. These 64 orthogonal codes correspond to Walsh codes from a 64 by 64 Hadamard matrix wherein a Walsh code is a single row or column of the matrix. The modulator 110 outputs a sequence of Walsh codes 112 which correspond to the input data symbols 108 at a fixed symbol rate (e.g., 307.2 ksym/s) to one input of an exclusive-OR combiner 116.

A long pseudo-noise (PN) generator 114 is operatively coupled to the other input of the exclusive-OR combiner 116 to provide a spreading sequence to the exclusive-OR combiner 116. The long PN generator 114 uses a long PN sequence to generate a user specific sequence of symbols or unique user spreading code at a fixed chip rate (e.g., 1.228 Mchp/s). In addition to providing an identification as to which user sent the traffic channel data bits 100 over the communication channel, the unique user code enhances the security of the communication in the communication channel by scrambling the traffic channel data bits 100. Exclusive-OR combiner 116 uses the unique user code input by long PN generator 114 to spread the input Walsh coded data symbols 112 into user code spread data symbols 118. The user code spread data symbols 118 are output from the exclusive-OR combiner 116 at a fixed chip rate (e.g., 1.2288 Mchp/s).

The user code spread data symbols 118 are provided to an input of two exclusive-OR combiners 120 and 126, respectively. A pair of short PN sequences (i.e. short when compared to the long PN sequence used by the long PN generator 114) are generated by I-channel PN generator 122 and Q-channel PN generator 128. These PN generators 122 and 128 may generate the same or different short PN sequences. The exclusive-OR combiners 120 and 126 further spread the input user code spread data 114 with the short PN sequences generated by the PN I-channel generator 122 and PN Q-channel generator 128, respectively. The resulting I-channel code spread sequence 124 and Q-channel code spread sequence 125 are used to bi-phase modulate a quadrature pair of sinusoids by driving the power level controls of the pair of sinusoids. The sinusoids output signals are summed, bandpass filtered, translated to an RF frequency, amplified, filtered and radiated by an antenna to complete transmission of the traffic channel data bits 100 in a communication channel.

Figure 2:
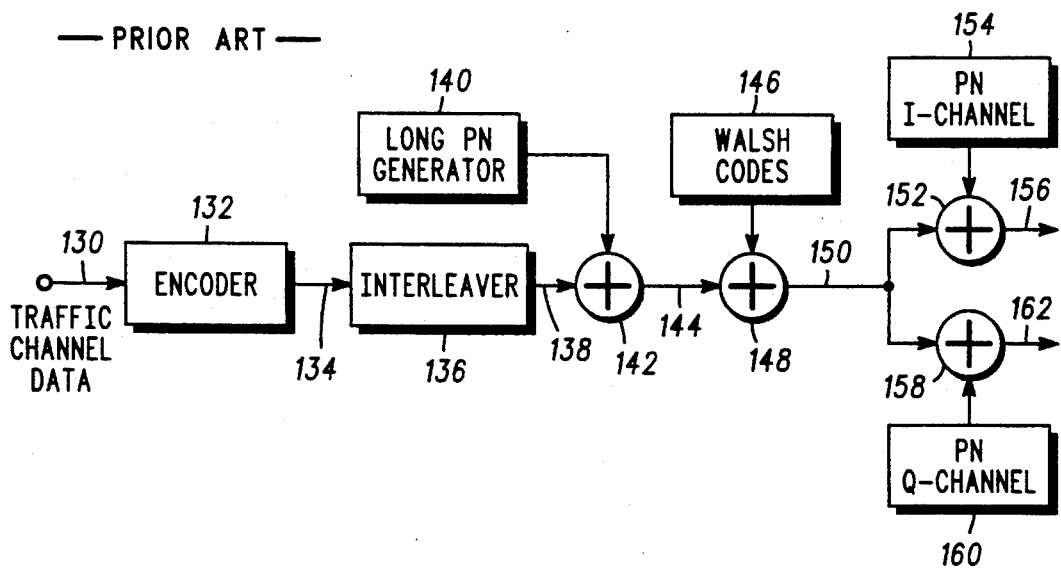
FIG. 2 is a diagram showing an alternative prior art spread spectrum transmitter.

Referring now to FIG. 2, a prior art spread spectrum transmitter is shown. In the prior art spread spectrum transmitter, traffic channel data bits 130 are input to an encoder 132 at a particular bit rate (e.g., 9.6 kbit/s). The traffic channel data bits can include either voice converted to data by a vocoder, pure data, or a combination of the two types of data. Encoder 132 convolutionally encodes the input data bits 130 into data symbols at a fixed encoding rate. For example, encoder 132 encodes received data bits 130 at a fixed encoding rate of one data bit to two data symbols such that the encoder 132 outputs data symbols 134 at a 19.2 ksym/s rate. The encoder 132 accommodates the input of data bits 130 at variable rates by encoding repetition. That is when the data bit rate is slower than the particular bit rate at which the encoder 132 is designed to operate, then the encoder 132 repeats the input data bits 130 such that the input data bits 130 are provided to the encoding elements within the encoder 132 at the equivalent of the input data bit rate at which the encoding elements are designed to operate. Thus, the encoder 132 outputs data symbols 134 at the same fixed rate regardless of the rate at which data bits 130 are input to the encoder 132.

The data symbols 134 are then input into an interleaver 136. Interleaver 136 interleaves the input data symbols 134. The interleaved data symbols 138 are output by the interleaver 136 at the same data symbol rate that they were input (e.g., 19.2 ksym/s) to one input of an exclusive-OR combiner 142.

A long PN generator 140 is operatively coupled to the other input of the exclusive-OR combiner 142 to enhance the security of the communication in the communication channel by scrambling the data symbols 138. The long PN generator 140 uses a long PN sequence to generate a user specific sequence of symbols or unique user code at a fixed rate equal to the data symbol rate of the data symbols 138 which are input to the other input of the exclusive-OR gate 142 (e.g., 19.2 ksym/s). The scrambled data symbols 144 are output from the exclusive-OR combiner 142 at a fixed rate equal to the rate that the data symbols 138 are input to the exclusive-OR gate 142 (e.g., 19.2 ksym/s) to one input of an exclusive-OR combiner 148.

A code division channel selection generator 146 provides a particular predetermined length Walsh code to the other input of the exclusive-OR combiner 148. The code division channel selection generator 146 can provide one of 64 orthogonal codes corresponding to 64 Walsh codes from a 64 by 64 Hadamard matrix wherein a Walsh code is a single row or column of the matrix. The exclusive-OR combiner 148 uses the particular Walsh code input by the code division channel generator 146 to spread the input scrambled data symbols 144 into Walsh code spread data symbols 150. The Walsh code spread data symbols 150 are output from the exclusive-OR combiner 148 at a fixed chip rate (e.g., 1.2288 Mchp/s).

The Walsh code spread data symbols 150 are provided to an input of two exclusive-OR combiners 152 and 158, respectively. A pair of short PN sequences (i.e. short when compared to the long PN sequence used by the long PN generator 140) are generated by I-channel PN generator 154 and Q-channel PN generator 160. These PN generators 154 and 160 may generate the same or different short PN sequences. The exclusive-OR combiners 152 and 158 further spread the input Walsh code spread data 150 with the short PN sequences generated by the PN I-channel generator 154 and PN Q-channel generator 160, respectively. The resulting I-channel code spread sequence 156 and Q-channel code spread sequence 162 are used to bi-phase modulate a quadrature pair of sinusoids by driving the power level controls of the pair of sinusoids. The sinusoids' output signals are summed, bandpass filtered, translated to an RF frequency, amplified, filtered and radiated by an antenna to complete transmission of the traffic channel data bits 130 in a communication channel.

Figure 3:
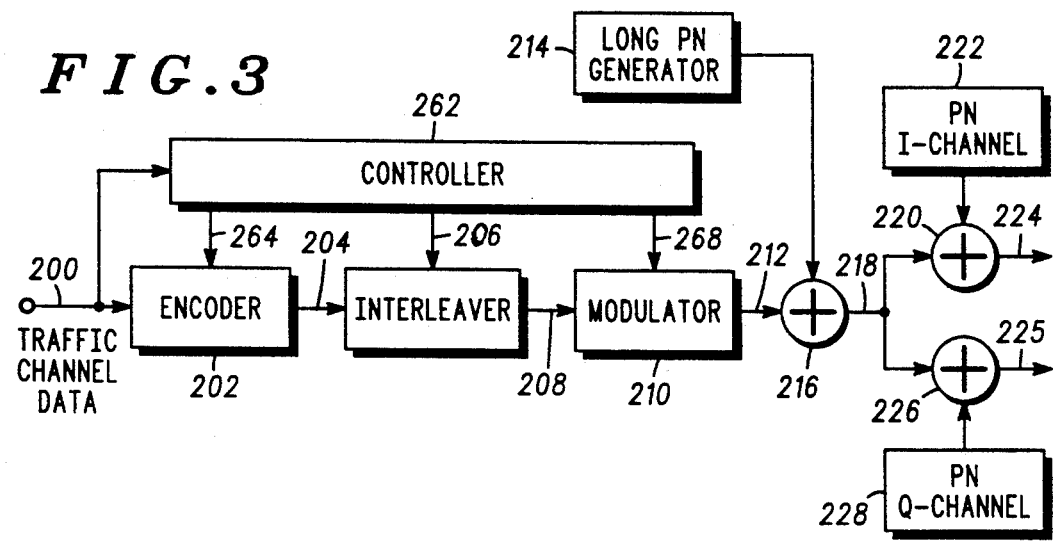
FIG. 3 is a diagram showing a preferred embodiment spread spectrum transmitter.

Referring now to FIG. 3, a preferred embodiment spread spectrum transmitter is shown which improves upon the prior art spread spectrum transmitter shown in FIG. 1. In the preferred embodiment spread spectrum transmitter, traffic channel data bits 200 are input to an encoder 202 at a particular bit rate (e.g., 9.6 kbit/s). The traffic channel data bits can include either a voice converted to data by a vocoder, pure data, or a combination of the two types of data. Encoder 202 preferably convolutionally encodes the input data bits 200 into data symbols at a predetermined encoding rate and outputs the data symbols 204. It will be appreciated by those skilled in the art that other types of encoding can be used without departing from the scope of the present invention. In one example of a preferred embodiment implementation, encoder 202 encodes received data bits 200 at a predetermined encoding rate of one data bit to three data symbols such that the encoder 202 outputs data symbols 204 at a 28.8 ksym/s rate.

The data symbols 204 are then input into an interleaver 206. Interleaver 206 preferably block interleaves the input data symbols 204. In the interleaver 206, the data symbols are input column by column into a matrix and output from the matrix row by row. It will be appreciated by those skilled in the art that other types of interleaving such as convolutional interleaving can be used in place of block interleaving without departing from the scope of the present invention. The interleaved data symbols 208 are output by the interleaver 206 at the same data symbol rate that they were input (e.g., 28.8 ksym/s).

The interleaved data symbols 208 are then input to a modulator 210. The modulator 210 preferably derives a sequence of predetermined length Walsh codes 212 (e.g., 64-ary orthogonal codes) from the interleaved data symbols 208. In 64-ary orthogonal code signalling, the interleaved data symbols 208 are grouped into sets of six to select one out of the 64 orthogonal codes to represent the set of six data symbols. These 64 orthogonal codes correspond to Walsh codes from a 64 by 64 Hadamard matrix wherein a Walsh code is a single row or column of the matrix. It will be appreciated by those skilled in the art that other types of orthogonal codes can be substituted for the Walsh codes without departing from the scope of the present invention. For example, codes derived from a set of mutually orthogonal sine waves could be substituted for the Walsh codes. In the preferred embodiment, the modulator 210 outputs a sequence of Walsh codes 212 which correspond to the input data symbols 208 at a fixed symbol rate (e.g., 307.2 ksym/s) to one input of an exclusive-OR combiner 216.

A long PN generator 214 is operatively coupled to the other input of the exclusive-OR combiner 216 to provide a spreading sequence to the exclusive-OR combiner 216. The long PN generator 214 uses a long PN sequence to generate a user specific sequence of symbols or unique user code at a fixed chip rate (e.g., 1.228 Mchp/s). In addition to providing an identification as to which user sent the traffic channel data bits 200 over the communication channel, the unique user code enhances the security of the communication in the communication channel by scrambling the traffic channel data bits 200. Exclusive-OR combiner 216 uses the unique user code input by long PN generator 214 to spread the input Walsh coded data symbols 212 into user code spread data symbols 218. This spreading by the exclusive-OR combiner 218 provides a factor increase in the overall spreading of the traffic channel data bits 200 to data symbols 218. The user code spread data symbols 218 are output from the exclusive-OR combiner 216 at a fixed chip rate (e.g., 1.2288 Mchp/s).

The user code spread data symbols 218 are provided to an input of two exclusive-OR combiners 220 and 226, respectively. A pair of short PN sequences (i.e. short when compared to the long PN sequence used by the long PN generator 214) are generated by I-channel PN generator 222 and Q-channel PN generator 228. These PN generators 222 and 228 may generate the same or different short PN sequences. The exclusive-OR combiners 220 and 226 further spread the input user code spread data 214 with the short PN sequences generated by the PN I-channel generator 222 and PN Q-channel generator 228, respectively. The resulting I-channel code spread sequence 224 and Q-channel code spread sequence 225 are used to bi-phase modulate a quadrature pair of sinusoids by driving the power level controls of the pair of sinusoids. The sinusoids output signals are summed, bandpass filtered, translated to an RF frequency, amplified, filtered and radiated by an antenna to complete transmission of the traffic channel data bits 200 in a communication channel.

The preferred embodiment transmitter accommodates the input of data bits 200 at variable data bit rates by utilizing a controller 262 to control encoder 202, interleaver 206 and modulator 210. The controller 263 accommodates the variable data bit rates by inputting the traffic channel data bits 200 and measuring the data bit rate. Subsequently, controller 263 sends signals 264 and 266 to encoder 202 and interleaver 206, respectively, to adjust the predetermined encoding rate to accommodate the particular measured data bit rate. This adjustment of the encoding rate can be accomplished by implementing a puncture algorithm in the encoder 202 and interleaver 206 with the controller 263. A puncture algorithm selectively deletes data symbols from the sequence of data symbols 208 eventually output by the interleaver 206. Through the implementation of a puncture algorithm, an effective encoding rate of received data bits to data symbols can be an integral or non-integral number (e.g., $\frac{1}{3}$, $\frac{1}{3}.4$, or $\frac{1}{3}$ encoding rate is possible). In addition to the controller 263 sending signals to the encoder 202 and interleaver 206, controller 263 sends a signal 268 to modulator 210 to adjust the predetermined length of the Walsh codes to be used by the modulator 210. Higher data rates can be accommodated within a spread spectrum system such as one based on the use of 64 symbol length Walsh codes by allowing a lower order Walsh code (e.g., 32 bit length Walsh codes) to operate along with the 64 bit length Walsh codes. In the preferred embodiment transmitter, the essential notion for providing a higher data rate traffic channel is to reduce the Walsh code for that channel from 64 bit length to 32 bit length while maintaining orthogonality between all of the Walsh codes used. This is accomplished by prohibiting the use of the two 64 bit length Walsh codes (or maximum length Walsh codes for this preferred embodiment spread spectrum transmitter) that have the 32 bit length Walsh code as their building block. An additional consideration is that the higher data rate channel must be transmitted at a higher power to compensate for the reduced amount of spreading of the input data bit to a larger number of data symbols. Some possible controller implemented settings of the predetermined encoding rate and the predetermined Walsh code length in response to the input data bit rates are shown below in Table 1.

TABLE 1

| Data Symbol Rate Limit (Mchp/s) | Input Data Bit Rate (kbit/s) | Total Spread Factor | Encoding Factor | Convert Factor (Walsh code/bits) | Walsh Code Factor | User Code Factor |
|---|---|---|---|---|---|---|
| 1.2288 | 9.6 | 128 | 3 | 1/6 | 64 | 4 |
| 1.2288 | 4.8 | 256 | 6 | 1/6 | 64 | 4 |
| 1.2288 | 19.2 | 64 | 2.5 | 1/5 | 32 | 4 |
| 1.2288 | 19.2 | 64 | 3 | 1/6 | 64 | 2 |
| 1.2288 | 16 | 76.8 | 3 | 1/5 | 32 | 4 |
| 1.2288 | 16 | 76.8 | 3.6 | 1/6 | 64 | 2 |

An example of the controller 263 using information from Table 1 is that the controller determines the rate of input of the traffic channel data bits 200 is 19.2 kbits/second (see row 3 of Table 1). Because, the controller 263 is attempting to limit the final data symbol rate to 1.2288 Mchips/second, the controller 263 needs to have an overall spreading factor of 64 (i.e. for each bit input to the encoder 202 a maximum of 64 symbols representing the bit can be output by the modulator 210). Therefore, the controller 263 sets the predetermined encoding rate to 2.5 and the predetermined Walsh code length to 32 bits. Further, the controller is relying on the conversion factor in the use of a 32 bit length Walsh code of 1/5 and a user code spreading factor of 4 inherent in the exclusive-OR combining 216 of the user code from the long PN generator 214 with the data symbols 212. Thus, the overall spreading factor of 64 is achieved by multiplying 2.5, 1/5, 32 and 4 together. In addition, the controller must remember to eliminate the two 64 bit length Walsh codes which are related to the 32 bit length Walsh code. It will be appreciated by those skilled in the art that the numerals shown in Table 1 are merely examples of possible numerals which can be used by a spread spectrum communication system and that there are many other possible sets of numerals which can be used without departing from the scope of the present invention.

Figure 4:
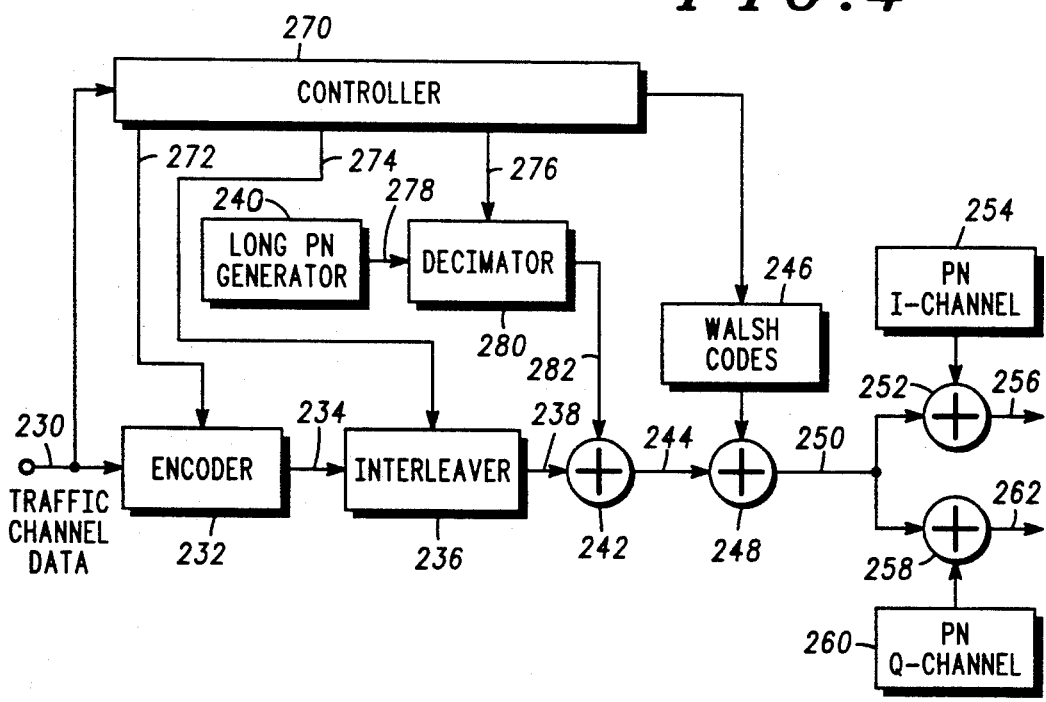
FIG. 4 is a diagram showing an alternative preferred embodiment spread spectrum transmitter.

Referring now to FIG. 4, an alternative preferred embodiment spread spectrum transmitter is shown which improves upon the prior art spread spectrum transmitter shown in FIG. 2. In the alternative embodiment spread spectrum transmitter, traffic channel data bits 230 are input to an encoder 232 at a particular bit rate (e.g., 9.6 kbit/s). The traffic channel data bits can include either a voice converted to data by a vocoder, pure data, or a combination of the two types of data. Encoder 232 preferably convolutionally encodes the input data bits 230 into data symbols at a predetermined encoding rate and outputs the data symbols 234. It will be appreciated by those skilled in the art that other types of encoding can be used without departing from the scope of the present invention. In one example of a preferred alternative embodiment implementation, encoder 232 encodes received data bits 230 at a predetermined encoding rate of one data bit to two data symbols such that the encoder 232 outputs data symbols 234 at a 19.2 ksym/s rate.

The data symbols 234 are then input into an interleaver 236. Interleaver 236 preferably convolutionally interleaves the input data symbols 234. It will be appreciated by those skilled in the art that other types of interleaving such as block interleaving can be used in place of convolutional interleaving without departing from the scope of the present invention. The interleaved data symbols 238 are output by the interleaver 236 at the same data symbol rate that they were input (e.g., 19.2 ksym/s) to one input of an exclusive-OR combiner 242.

Optionally, a long PN generator 240 is operatively coupled to the other input of the exclusive-OR combiner 242 to enhance the security of the communication in the communication channel by scrambling the data symbols 238. The long PN generator 240 uses a long PN sequence to generate a user specific sequence of symbols or unique user code. The user code 278 is input to a decimator 280 which limits the rate at which the user code is input to the other input of the exclusive-OR combiner 242 to the same data symbol rate that the interleaver 236 outputs the data symbols to the other input of the exclusive-OR combiner 242. The scrambled data symbols 238 are output from the exclusive-OR combiner 242 at a fixed rate equal to the rate that the data symbols 238 are input to the exclusive-OR gate 242 (e.g., 19.2 ksym/s) to one input of an exclusive-OR combiner 248.

A code division channel selection generator 246 preferably provides a particular predetermined length Walsh code to the other input of the exclusive-OR combiner 248. The code division channel selection generator 246 can provide one of 64 orthogonal codes corresponding to 64 Walsh codes from a 64 by 64 Hadamard matrix wherein a Walsh code is a single row or column of the matrix. The exclusive-OR combiner 248 uses the particular Walsh code input by the code dividion channel generator 246 to spread the input scrambled data symbols 238 into Walsh code spread data symbols 250. The Walsh code spread data symbols 250 are output from the exclusive-OR combiner 248 at a fixed chip rate (e.g., 1.2288 Mchp/s).

The Walsh code spread data symbols 250 are provided to an input of two exclusive-OR combiners 252 and 258, respectively. A pair of short PN sequences (i.e. short when compared to the long PN sequence used by the long PN generator 240) are generated by I-channel PN generator 254 and Q-channel PN generator 260. These PN generators 254 and 260 may generate the same or different short PN sequences. The exclusive-OR combiners 252 and 258 further spread the input Walsh code spread data 250 with the short PN sequences generated by the PN I-channel generator 254 and PN Q-channel generator 260, respectively. The resulting I-channel code spread sequence 256 and Q-channel code spread sequence 262 are used to bi-phase modulate a quadrature pair of sinusoids by driving the power level controls of the pair of sinusoids. The sinusoids output signals are summed, bandpass filtered, translated to an RF frequency, amplified, filtered and radiated by an antenna to complete transmission of the traffic channel data bits 230 in a communication channel.

The alternate preferred embodiment transmitter accommodates the input of data bits 230 at variable data bit rates by utilizing a controller 270 to control encoder 232, interleaver 236, decimator 280 and code division channel selection generator 246. The controller 270 accommodates the variable data bit rates by inputting the traffic channel data bits 230 and measuring the data bit rate. Subsequently, controller 270 sends signals 272 and 274 to encoder 232 and interleaver 236, respectively, to adjust the predetermined encoding rate to accommodate the particular measured data bit rate. This adjustment of the encoding rate can be accomplished by implementing a puncture algorithm in the encoder 232 and interleaver 236 with the controller 270. A puncture algorithm selectively deletes data symbols from the sequence of data symbols 238 eventually output by the interleaver 236. Through the implementation of a puncture algorithm an effective encoding rate of received data bits to data symbols can be an integral or non-integral number (e.g., ½, ½.4, or ⅓ encoding rate is possible). In addition to the controller 270 sending signals to the encoder 232 and interleaver 236, controller 270 sends a signal 276 to decimator 280 to adjust the rate at which the user code is input to the other input of the exclusive-OR combiner 242. Further, controller 270 sends a signal to channel division selection generator 246 to adjust the predetermined length of the Walsh code to be used by the code division channel generator 246. Higher data rates can be accommodated within a spread spectrum system such as one based on the use of 64 symbol length Walsh codes by allowing a lower order Walsh code (e.g., 32 bit length Walsh codes) to operate along with the 64 bit length Walsh codes. In the alternative preferred embodiment transmitter, the essential notion for providing a higher data rate traffic channel is to reduce the Walsh code for that channel from 64 bit length to 32 bit length while maintaining orthogonality between all of the Walsh codes used. This is accomplished by prohibiting the use of the two 64 bit length Walsh codes (or maximum length Walsh codes for this preferred embodiment spread spectrum transmitter) that have the 32 bit length Walsh code as their building block. An additional consideration is that the higher data rate channel must be transmitted at a higher power to compensate for the reduced amount of spreading of the input data bit to a larger number of data symbols. Some possible controller implemented settings of the predetermined encoding rate, and the predetermined Walsh code length in response to the input data bit rates are shown below in Table 2.

TABLE 2

| Data Symbol Rate Limit (Mchp/s) | Input Data Bit Rate (kbit/s) | Total Spread Factor | Encoding Factor | Walsh Code Factor |
| --- | --- | --- | --- | --- |
| 1.2288 | 9.6 | 128 | 2 | 64 |
| 1.2288 | 4.8 | 256 | 4 | 64 |
| 1.2288 | 19.2 | 64 | 2 | 32 |
| 1.2288 | 16 | 76.8 | 2.4 | 32 |

An example of the controller 270 using information from Table 2 is that the controller determines the rate of input of the traffic channel data bits 230 is 19.2 kbits/second (see row 3 of Table 1). Because the controller 270 is attempting to limit the final data symbol rate to 1.2288 Mchips/second, the controller 270 needs to have an overall spreading factor of 64 (i.e. for each bit input to the encoder 232 a maximum of 64 symbols representing the bit can be output by the exclusive-OR combiner 250). Therefore, the controller 270 sets the predetermined encoding rate to 2 and the predetermined Walsh code length to 32. Thus, the overall spreading factor of 64 is achieved by multiplying 2 and 32 together. In addition, the controller must remember to eliminate the two 64 bit length Walsh codes which are related to the 32 bit length Walsh code. It will be appreciated by those skilled in the art that the numerals shown in Table 2 are merely examples of possible numerals which can be used by a spread spectrum communication system and that there are many other possible sets of numerals which can be used without departing from the scope of the present invention.

Although the invention has been described and illustrated with a certain degree of particularity, it is understood that the present disclosure of embodiments has been made by way of example only and that numerous changes in the arrangement and combination of parts as well as steps may be resorted to by those skilled in the art without departing from the spirit and scope of the invention as claimed.

What is claimed is:

1. A spread spectrum channel apparatus which accommodates variable received data bit rates, comprising:

(a) forward error correction encoder means for receiving data bits at a particular bit rate and encoding the received data bits at a predetermined encoding rate into data symbols, the predetermined encoding rate being set in response to the received data bit rate; and (b) modulator means, operatively coupled to the forward error correction encoder means, for deriving predetermined length orthogonal codes from the data symbols, the predetermined length of the orthogonal codes being set in response to the received data bit rate.

2. The spread spectrum channel apparatus of claim 1 wherein the forward error correction encoder means comprises means for setting the predetermined encoding rate through implementation of a puncture algorithm.

3. The spread spectrum channel apparatus of claim 1 wherein the forward error correction encoder means comprises a symbol interleaver means for scrambling the data symbols prior to the modulator means deriving orthogonal codes from the data symbols.

4. The spread spectrum channel apparatus of claim 1 further comprising a transmitting means, operatively coupled to the modulator means, for transmitting the derived orthogonal codes over a communication channel, the transmitting means comprises spreading means for preparing the derived orthogonal codes for subsequent transmission by spreading the derived orthogonal codes with a spreading code.

5. The spread spectrum channel apparatus of claim 4 further comprising:

(a) despreading means for sampling the transmitted spread orthogonal codes received from over the communication channel into data samples by despreading the received orthogonal codes with a spreading code; and (b) decoding means, operatively coupled to the despreading means, for generating an estimated data bit by deriving the estimated data bit from the data samples.

6. A spread spectrum channel apparatus which accommodates variable received data bit rates, comprising:

(a) despreading means for sampling a signal received from over the communication channel into data samples by despreading the received signal with a spreading code, the received signal comprising spread orthogonal codes wherein the spread orthogonal codes were formed from data bits received at a particular bit rate and encoded at a predetermined encoding rate into data symbols, predetermined length orthogonal codes were derived from the data symbols, and subsequently the derived orthogonal codes were prepared for subsequent transmission by being spread with a spreading code, the predetermined encoding rate and the predetermined length of the orthogonal codes having been set in response to the received data bit rate: and (b) decoding means, operatively coupled to the despreading means, for generating an estimated data bit by deriving the estimated data bit from the data samples.

7. A spread spectrum channel apparatus which accommodates variable received data bit rates, comprising:

(a) forward error correction encoder means for receiving data bits at a particular bit rate and encoding the received data bits at a predetermined encoding rate into data symbols, the predetermined encoding rate being set in response to the received data bit rate; and (b) code division channel means, operatively coupled to the forward error correction encoder means, for determining a particular channel to transmit the data symbols by spreading the data symbols with a predetermined length orthogonal code, the predetermined length of the orthogonal code being set in response to the received data bit rate.

8. The spread spectrum channel apparatus of claim 7 wherein the forward error correction encoder means comprises means for setting the predetermined encoding rate through implementation of a puncture algorithm.

9. The spread spectrum channel apparatus of claim 7 wherein the forward error correction encoder means comprises scrambling means for scrambling the data symbols with a spreading code prior to the code division channel means determining a particular channel to transmit the data symbols by spreading the data symbols with a predetermined length orthogonal code.

10. The spread spectrum channel apparatus of claim 7 wherein the forward error correction encoder means comprises a symbol interleaver means for scrambling the data symbols prior to the code division channel means determining a particular channel to transmit the data symbols by spreading the data symbols with a predetermined length orthogonal code.

11. The spread spectrum channel apparatus of claim 7 further comprising a transmitting means, operatively coupled to the code division channel means, for transmitting the orthogonal coded spread data symbols over a communication channel, the transmitting means comprises spreading means for preparing the orthogonal coded data symbols for subsequent transmission by spreading the orthogonal coded data symbols with a spreading code.

12. The spread spectrum channel apparatus of claim 11 further comprising:
(a) despreading means for sampling the transmitted spread orthogonal codes received from over the communication channel into data samples by despreading the received orthogonal codes with a spreading code; and
(b) decoding means, operatively coupled to the despreading means, for generating an estimated data bit by deriving the estimated data bit from the data samples.

13. A spread spectrum channel apparatus which accommodates variable received data bit rates, comprising:
(a) despreading means for sampling a signal received from over the communication channel into data samples by despreading the received signal with a spreading code, the received signal comprising spread orthogonal codes wherein the spread orthogonal codes were formed from data bits received at a particular bit rate and encoded at a predetermined encoding rate into data symbols, predetermined length orthogonal codes spread the data symbols, and subsequently the orthogonal code spread data symbols were prepared for subsequent transmission by being spread with a spreading code, the predetermined encoding rate and the predetermined length of the orthogonal codes having been set in response to the received data bit rate; and
(b) decoding means, operatively coupled to the despreading means, for generating an estimated data bit by deriving the estimated data bit from the data samples.

14. The spread spectrum channel apparatus of claim 7 wherein the code division channel means comprises means for limiting the number of orthogonal codes used when a less than maxiumum length orthogonal code is used such that orthogonality of the maximum length orthogonal codes is maintained with respect to the less than maximum length orthogonal code.

15. A method of communicating a spread spectrum signal while accommodating variable traffic data bit rates, comprising:
(a) determining the particular bit rate at which received traffic data bits were provided to a spread spectrum channel apparatus;
(b) setting a predetermined encoding rate and a predetermined length for an orthogonal code in response to the determined particular bit rate;
(c) encoding received data bits at the predetermined encoding rate into data symbols; and
(d) deriving orthogonal codes of the predetermined length from the data symbols.

16. The method of claim 15 wherein the step of setting the predetermined encoding rate comprises implementation of a puncture algorithm.

17. The method of claim 15 further comprising the step of interleaving the data symbols prior to the step of deriving predetermined length orthogonal codes from the data symbols.

18. The method of claim 15 further comprising the step of transmitting the derived orthogonal codes over a communication channel, the transmitting step comprising preparing the derived orthogonal codes for subsequent transmission by spreading the derived orthogonal codes with a spreading code.

19. The method of claim 18 further comprising the steps of
(a) sampling the transmitted spread orthogonal codes received from over the communication channel into data samples by despreading the received orthogonal codes with a spreading code; and
(b) generating an estimated data bit by deriving the estimated data bit from the data samples.

20. A method of communicating a spread spectrum signal while accommodating variable traffic data bit rates, comprising:
(a) sampling a signal received from over the communication channel into data samples by despreading the received signal with a spreading code, the received signal comprising spread orthogonal codes wherein the spread orthogonal codes were formed from data bits received at a particular bit rate and encoded at a predetermined encoding rate into data symbols, predetermined length orthogonal codes were derived from the data symbols, and subsequently the derived orthogonal codes were prepared for subsequent transmission by being spread with a spreading code, the predetermined encoding rate and the predetermined length of the orthogonal codes having been set in response to the received data bit rate; and
(b) generating an estimated data bit by deriving the estimated data bit from the data samples.

21. A method of communicating a spread spectrum signal while accommodating variable traffic data bit rates, comprising:

(a) determining the particular bit rate at which received traffic data bits were provided to a spread spectrum channel apparatus;
(b) setting a predetermined encoding rate and a predetermined length for an orthogonal code in response to the determined particular bit rate;
(c) encoding received data bits at the predetermined encoding rate into data symbols; and
(d) determining a particular channel to transmit the data symbols by spreading the data symbols with a predetermined length orthogonal code.

22. The method of claim 21 wherein the step of setting the predetermined encoding rate comprises implementation of a puncture algorithm.

23. The method of claim 21 further comprising the step of scrambling the data symbols with a spreading code prior to the step of determining a particular channel to transmit the data symbols.

24. The method of claim 21 further comprising the step of interleaving the data symbols prior to the step of determining a particular channel to transmit the data symbols.

25. The method of claim 21 further comprising the step of transmitting the orthogonal coded spread data symbols over a communication channel, the step of transmitting comprising preparing the orthogonal coded data symbols for subsequent transmission by spreading the orthogonal coded data symbols with a spreading code.

26. The method of claim 25 further comprising the steps of:
(a) sampling the transmitted spread orthogonal codes received from over the communication channel into data samples by despreading the received orthogonal codes with a spreading code; and
(b) generating an estimated data bit by deriving the estimated data bit from the data samples.

27. A method of communicating a spread spectrum signal while accommodating variable traffic data bit rates, comprising:
(a) sampling a signal received from over the communication channel into data samples by despreading the received signal with a spreading code, the received signal comprising spread orthogonal codes wherein the spread orthogonal codes were formed from data bits received at a particular bit rate and encoded at a predetermined encoding rate into data symbols, predetermined length orthogonal codes spread the data symbols, and subsequently the orthogonal code spread data symbols were prepared for subsequent transmission by being spread with a spreading code, the predetermined encoding rate and the predetermined length of the orthogonal codes having been set in response to the received data bit rate; and
(b) generating an estimated data bit by deriving the estimated data bit from the data samples.

28. The method of claim 21 further comprising the step of limiting the number of orthogonal codes used in the step of determining a particular channel to transmit the data symbols when a less than maximum length orthogonal code is used such that orthogonality of the maximum length orthogonal codes is maintained with respect to the less than maximum length orthogonal code.

* * * * *